(12) United States Patent
Hu et al.

(10) Patent No.: US 11,616,147 B2
(45) Date of Patent: Mar. 28, 2023

(54) THIN FILM TRANSISTOR AND MANUFACTURING METHOD THEREOF, DISPLAY SUBSTRATE AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yingbin Hu, Beijing (CN); Ce Zhao, Beijing (CN); Yuankui Ding, Beijing (CN); Wei Song, Beijing (CN); Liusong Ni, Beijing (CN); Xuechao Sun, Beijing (CN); Chaowei Hao, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 183 days.

(21) Appl. No.: 17/254,851

(22) PCT Filed: Apr. 8, 2020

(86) PCT No.: PCT/CN2020/083683
§ 371 (c)(1),
(2) Date: Dec. 21, 2020

(87) PCT Pub. No.: WO2020/207400
PCT Pub. Date: Oct. 15, 2020

(65) Prior Publication Data
US 2021/0265510 A1    Aug. 26, 2021

(30) Foreign Application Priority Data

Apr. 9, 2019 (CN) .......................... 201910281442.0

(51) Int. Cl.
*H01L 29/786* (2006.01)
*H01L 21/02* (2006.01)
(Continued)

(52) U.S. Cl.
CPC .. *H01L 29/78618* (2013.01); *H01L 21/02565* (2013.01); *H01L 27/127* (2013.01);
(Continued)

(58) Field of Classification Search
CPC ....... H01L 21/02565; H01L 21/823412; H01L 21/823418; H01L 21/823807;
(Continued)

(56) References Cited

U.S. PATENT DOCUMENTS

2018/0097023 A1\* 4/2018 Choi ................. H01L 29/42384

FOREIGN PATENT DOCUMENTS

CN          104576761 A    4/2015
CN          104835851 A    8/2015
(Continued)

OTHER PUBLICATIONS

First Office Action with Search Report dated Mar. 1, 2021 corresponding to Chinese application No. 201910281442.0.

*Primary Examiner* — Cheung Lee
(74) *Attorney, Agent, or Firm* — Nath, Goldberg & Meyer; Joshua B. Goldberg

(57) ABSTRACT

The disclosure provides a thin film transistor, a manufacturing method thereof, a display substrate and a display apparatus. The thin film transistor comprises a base substrate, and an active layer disposed on the base substrate, and the active layer comprises a channel region, and a source
(Continued)

contact region and a drain contact region respectively positioned at two sides of the channel region; and a portion of at least one of the source contact region and the drain contact region close to the channel region includes a plurality of first sub-grooves disposed at a side of the active layer proximal to the base substrate and a plurality of second sub-grooves disposed at a side of the active layer distal to the base substrate, and the plurality of first sub-grooves and the plurality of second sub-grooves being alternately disposed along a direction parallel to an extension of the channel region.

20 Claims, 5 Drawing Sheets

(51) Int. Cl.
  *H01L 27/12* (2006.01)
  *H01L 29/66* (2006.01)
  *H01L 29/08* (2006.01)
(52) U.S. Cl.
  CPC ...... *H01L 27/1225* (2013.01); *H01L 29/0869* (2013.01); *H01L 29/66969* (2013.01); *H01L 29/7869* (2013.01); *H01L 29/78633* (2013.01); *H01L 29/78696* (2013.01)

(58) Field of Classification Search
  CPC ......... H01L 21/823814; H01L 27/1214; H01L 27/1222; H01L 27/1225; H01L 27/1259; H01L 27/127; H01L 29/0847; H01L 29/66007; H01L 29/66742; H01L 29/66969; H01L 29/78618; H01L 29/78633; H01L 29/78642; H01L 29/7869; H01L 29/78696
  See application file for complete search history.

(56) References Cited

FOREIGN PATENT DOCUMENTS

| | | | |
|---|---|---|---|
| CN | 105895638 | A | 8/2016 |
| CN | 105990371 | A | 10/2016 |
| CN | 106024909 | A | 10/2016 |
| CN | 106328717 | A | 1/2017 |
| CN | 106356306 | A | 1/2017 |
| CN | 107195634 | A | 9/2017 |
| CN | 109585304 | A | 4/2019 |
| CN | 110010698 | A | 7/2019 |
| KR | 20060023709 | A | 3/2006 |

* cited by examiner

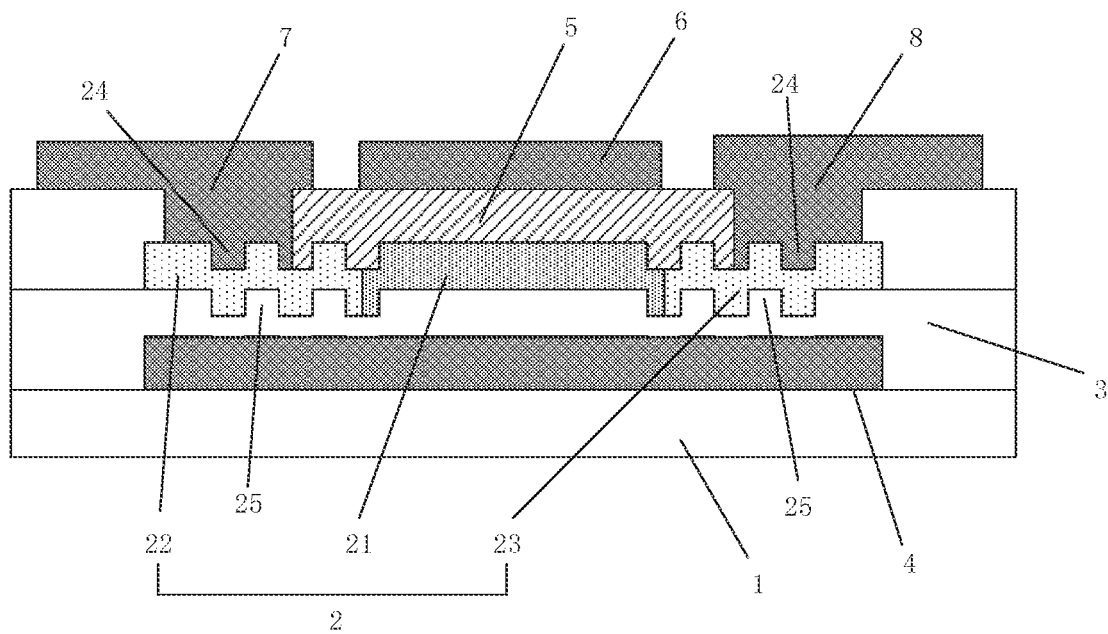

Fig. 8

| forming a base substrate, forming a light-shielding layer on the base substrate by a patterning process, and forming a plurality of second grooves on an upper surface of the light-shielding layer at positions corresponding to a portion of at least one of the source contact region and the drain contact region close to the channel region | S11 |

↓

| forming an insulating layer on the base substrate with the light-shielding layer formed thereon, and forming a plurality of first grooves on an upper surface of the insulating layer at positions corresponding to the portion of at least one of the source contact region and the drain contact region of the active layer close to the channel region | S12 |

↓

| forming an active layer on the base substrate with the insulating layer formed thereon | S13 |

Fig. 9

THIN FILM TRANSISTOR AND MANUFACTURING METHOD THEREOF, DISPLAY SUBSTRATE AND DISPLAY APPARATUS

CROSS-REFERENCE TO RELATED APPLICATIONS

This is a National Phase Application filed under 35 U.S.C. 371 as a national stage of PCT/CN2020/083683, filed Apr. 8, 2020, an application claiming the benefit of Chinese Application No. 201910281442.0, filed Apr. 9, 2019, the content of each of which is hereby incorporated by reference in its entirety.

TECHNICAL FIELD

The disclosure relates to the field of display technology, and particularly relates to a thin film transistor and a manufacturing method thereof, a display substrate and a display apparatus.

BACKGROUND

When a thin film transistor is manufactured, a conductive treatment is performed on semiconductor portions on both sides of a channel region of an active layer. Due to the diffusion effect, there is also a risk that the channel region of the active layer is transformed into a conductor, which may cause poor uniformity of the thin film transistor, resulting in undesirable phenomena such as bright spots on the display panel.

SUMMARY

The present disclosure is directed to solving at least one of the technical problems of the related art and to providing a thin film transistor that effectively prevents a channel region of an active layer from being conducted.

The technical solution adopted for solving the technical problem of the disclosure is providing a thin film transistor including a base substrate and an active layer disposed on the base substrate, and the active layer includes a channel region, and a source contact region and a drain contact region respectively located at two sides of the channel region; and a portion of at least one of the source contact region and the drain contact region close to the channel region includes a plurality of first sub-grooves disposed at a side of the active layer proximal to the base substrate and a plurality of second sub-grooves disposed at a side of the active layer distal to the base substrate, and the plurality of first sub-grooves and the plurality of second sub-grooves are disposed alternately along a direction parallel to an extension of the channel region.

In some embodiments, the plurality of first sub-grooves and the plurality of second sub-grooves have a same depth.

In some embodiments, the thin film transistor further includes an insulating layer disposed between the active layer and the base substrate; and a side of the insulating layer proximal to the active layer is provided with a plurality of first grooves, the plurality of first grooves are provided in the insulating layer at positions corresponding to the at least one of the source contact region and the drain contact region of the active layer close to the channel region, the plurality of first grooves are in one-to-one correspondence with the plurality of second sub-grooves, and orthographic projections of the plurality of first grooves and the plurality of second sub-grooves on the base substrate are overlapped, respectively.

In some embodiments, the thin film transistor further includes a light-shielding layer disposed between the base substrate and the insulating layer.

In some embodiments, a side of the light-shielding layer proximal to the insulating layer is provided with a plurality of second grooves, the plurality of second grooves are provided in the light-shielding layer at positions corresponding to the at least one of the source contact region and the drain contact region of the active layer close to the channel region, the plurality of second grooves are in one-to-one correspondence with the plurality of second sub-grooves, and orthographic projections of the plurality of second grooves and the plurality of second sub-grooves on the base substrate are overlapped, respectively.

In some embodiments, the thin film transistor further includes a gate insulating layer, a gate, a source and a drain sequentially disposed on the active layer.

In some embodiments, a material of the light-shielding layer includes aluminum, molybdenum, or copper.

In some embodiments, the plurality of second grooves penetrate through the light-shielding layer.

The present disclosure also provides a method for manufacturing a thin film transistor including forming a base substrate, and forming an active layer on the base substrate such that the active layer includes a channel region, and a source contact region and a drain contact region respectively located at two sides of the channel region; and forming a plurality of first sub-grooves at a side of the active layer proximal to the base substrate and a plurality of second sub-grooves at a side of the active layer distal to the base substrate at a portion of at least one of the source contact region and the drain contact region of the active layer close to the channel region, and the plurality of first sub-grooves and the plurality of second sub-grooves are disposed alternately along a direction parallel to an extension of the channel region.

In some embodiments, the plurality of first sub-grooves and the plurality of second sub-grooves have a same depth.

In some embodiments, before the forming an active layer on the base substrate, the method further includes: forming an insulating layer on the base substrate, and forming a plurality of first grooves on a side of the insulating layer proximal to the active layer at positions corresponding to the portion of the at least one of the source contact region and the drain contact region of the active layer close to the channel region; and forming an active layer on the base substrate on which the insulating layer is formed, such that the plurality of first grooves are in one-to-one correspondence with the plurality of second sub-grooves and orthographic projections of the plurality of first grooves and the plurality of second sub-grooves on the base substrate are overlapped.

In some embodiments, before the forming an insulating layer on the base substrate, the method further includes forming a light-shielding layer on the base substrate.

In some embodiments, the forming a light-shielding layer on the base substrate includes: forming a light-shielding layer on a base substrate by a patterning process, and forming a plurality of second grooves on a side of the light-shielding layer proximal to the insulating layer at positions corresponding to the portion of the at least one of the source contact region and the drain contact region of the active layer close to the channel region, such that the plurality of second grooves are in one-to-one correspondence with the plurality of second sub-grooves, and orthographic projections of the plurality of second grooves and the plurality of second sub-grooves on the base substrate are overlapped, respectively.

In some embodiments, the method further includes forming a gate insulating layer on the active layer, and forming a gate, a source and a drain on the gate insulating layer.

In some embodiments, the thin film transistor is a top-gate thin film transistor.

In some embodiments, a material of the light-shielding layer includes aluminum, molybdenum, or copper.

In some embodiments, the plurality of second grooves penetrate through the light-shielding layer.

The present disclosure also provides a display substrate including a base substrate, and a thin film transistor disposed on the base substrate; and the thin film transistor includes any one of the thin film transistors described above.

The disclosure also provides a display apparatus including the above display substrate.

BRIEF DESCRIPTION OF THE DRAWINGS

FIG. 8 is a schematic structural view illustrating a gate insulating layer, a gate, a source and a drain formed in a method for manufacturing a thin film transistor according to some embodiments of the disclosure:

FIG. 9 is a flowchart of a method for manufacturing a thin film transistor according to some embodiments of the present disclosure.

DETAILED DESCRIPTION

In order to make a person skilled in the art will better understand the technical solutions of the present disclosure, the following detailed description is given with reference to the accompanying drawings and the specific embodiments.

Figure 1:
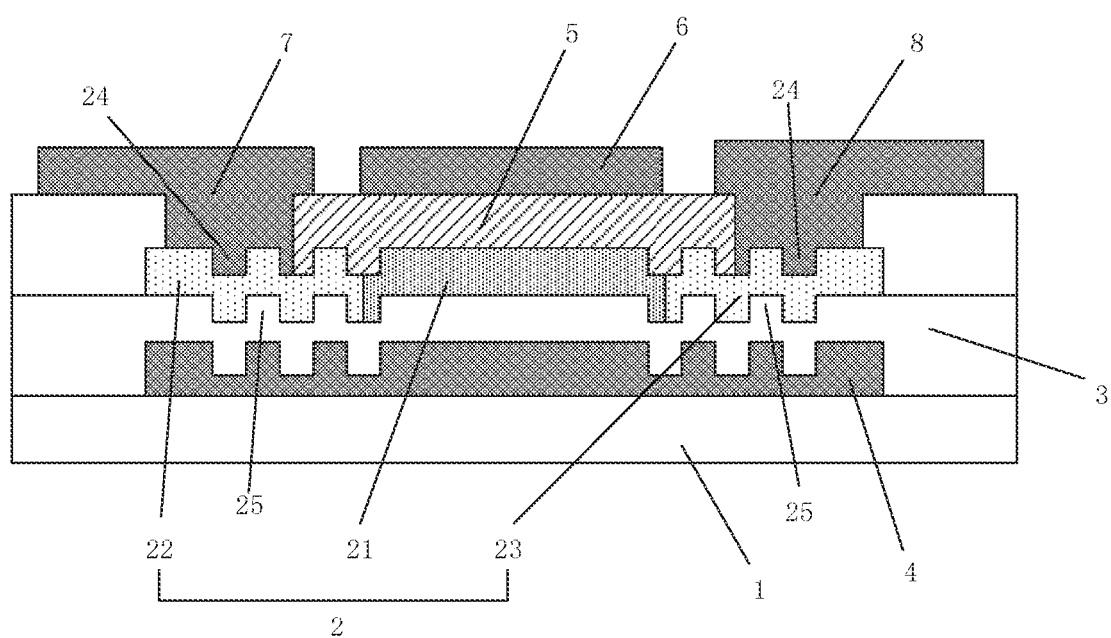
FIG. 1 is a schematic structural view of a thin film transistor according to some embodiments of the present disclosure.

According to some embodiments of the present disclosure, as shown in FIG. 1, the present embodiment provides a thin film transistor, which includes a base substrate 1, and an active layer 2, a gate insulating layer 5, a gate 6, a source and a drain sequentially disposed on the base substrate 1, and the source and the drain includes a source 7 and a drain 8. The active layer 2 includes a channel region 21 and a source contact region 22 and a drain contact region 23 respectively located at two sides of the channel region 21; a portion of at least one of the source contact region 22 and the drain contact region 23 of the active layer 2 close to the channel region 21 includes a plurality of first sub-grooves 25 disposed at a side of the active layer 2 proximal to the base substrate 1 and a plurality of second sub-grooves 24 disposed at a side of the active layer 2 distal to the base substrate 1, and the plurality of first sub-grooves 25 and the plurality of second sub-grooves 24 are disposed alternately along a direction parallel to an extension of the channel region 21.

It should be noted that, the plurality of first sub-grooves 24 and the plurality of second sub-grooves 25 have a same depth.

It should be understood that, the source contact region 22 and the drain contact region 23 of the active layer 2 each are of a semiconductor structure, and the source contact region 22 is electrically coupled to the source 7, and the drain contact region 23 is electrically coupled to the drain 8.

As shown in FIG. 1, in the present embodiment, a portion of at least one of the source contact region 22 and the drain contact region 23 of the active layer 2 close to the channel region 21 may be configured as a wave structure, such that the length of the active layer 2 is extended, particularly the length of the portion of the at least one of the source contact region 22 and the drain contact region 23 close to the channel region 21 is extended, and the thickness of the active layer 2 is reduced, thereby a transmission path of a conductive diffusion effect is extended effectively when the source contact region 22 and the drain contact region 23 of the active layer 2 are made to be conductive, which may eliminate an influence on the channel region 21, thereby good performance and uniformity of the thin film transistor can be ensured. Meanwhile, in the active layer 2 with a wave structure, atoms of a material of the active layer 2 are arranged distorted and disordered, to prevent the conductive diffusion effect from reaching the channel region 21, and good performance and uniformity of the thin film transistor can be ensured.

In some embodiments, the thin film transistor is a top-gate thin film transistor. In order to more clearly and specifically describe the thin film transistor in this embodiment, a top-gate thin film transistor is described as an example.

In some embodiments, the top-gate thin film transistor further includes an insulating layer 3 disposed on a side of the active layer 2 proximal to the base substrate 1; a plurality of first grooves 31 are formed in the insulating layer 3 on one side proximal to the active layer 2 and at positions corresponding to the portion of at least one of the source contact region 22 and the drain contact region 23 close to the channel region 21 of the thin film transistor, the plurality of first grooves 31 define the wave structure of the active layer 2, and the plurality of first grooves 31 are in one-to-one correspondence with the plurality of second sub-grooves 24 and orthographic projections of the plurality of first grooves 31 and the plurality of second sub-grooves 24 are overlapped on the base substrate.

That is, as shown in FIG. 1, the insulating layer 3 is in contact with the active layer 2, and the first grooves in the upper surface (the side distal to the base substrate 1) of the insulating layer 3 define the wave structure of the active layer 2. Specifically, when the thin film transistor is manufactured, the insulating layer 3 may be first formed on the base substrate 1, and the first grooves 31 are formed in the insulating layer 3 distal to the base substrate 1 and at positions corresponding to the source contact region 22 and the drain contact region 23 close to the channel region 21. Then, the active layer 2 is formed on the base substrate 1 with the insulating layer 3, and the wave structure of the active layer 2 is naturally formed at positions corresponding to the first grooves 31 (i.e., at positions where the source contact region 22 and the drain contact region 23 close to the channel region 21) with a height difference between different parts of a surface of the insulating layer 3, and the plurality of first grooves 31 are in one-to-one correspondence with the plurality of second sub-grooves 24 and orthographic projections of the plurality of first grooves 31 and the plurality of second sub-grooves 24 are overlapped on the base substrate.

It should be noted that, the plurality of second sub-grooves 24 and the plurality of first sub-grooves 25 are defined by a corrugated structure of an upper surface of the insulating layer 3 formed by an etching process. A thickness of the insulating layer 3 may include 2000 Å to 6000 Å, and in some embodiments, an etched depth at the upper surface of the insulating layer 3 may be 1000 Å. At this time, a depth of each of the plurality of second sub-grooves 24 and the plurality of first sub-grooves 25 may be 1000 Å. A material of the insulating layer may be silicon oxide, silicon nitride or a composite material of the silicon oxide and the silicon nitride.

In some embodiments, the top-gate thin film transistor may further include a light-shielding layer 4, which is disposed between the base substrate 1 and the insulating layer 3, and the insulating layer 3 is disposed between the light-shielding layer 4 and the active layer 2. As shown in FIG. 1, the light-shielding layer 4 is disposed on a side of the active layer 2 proximal to the base substrate 1 for blocking external light, which may prevent the active layer 2 from being influenced by the external light and further damage the performance of the thin film transistor. A material of the light-shielding layer 4 may include metal, and a metal with good light reflectivity is required, which is conventionally Al, Mo, or Cu. In order to avoid conductive properties of the light-shielding layer 4 from conducting the source contact region 22 and the drain contact region 23 of the active layer 2, the light-shielding layer 4 should be separated from the active layer 2 by the insulating layer 3.

In some embodiments, the light-shielding layer 4 is provided with a plurality of second grooves 41 at positions corresponding to the portion of at least one of the source contact region 22 and the drain contact region 23 close to the channel region 21, the plurality of second grooves 41 define the plurality of first grooves 31 and further define the wave structure, and the plurality of second grooves 41 are in one-to-one correspondence with the plurality of second sub-grooves 24 and orthographic projections of the plurality of second grooves and the plurality of second sub-grooves are overlapped on the base substrate. That is, in the procedure for manufacturing the thin film transistor, when the light-shielding layer 4 is formed on the base substrate 1, a plurality of second grooves 41 are formed on the upper surface (a surface distal to the base substrate 1) of the light-shielding layer 4 at positions corresponding to the source contact region 22 and the drain contact region 23 close to the channel region 21, and then the insulating layer 3 is formed, and the first grooves 31 is naturally formed on the insulating layer 3 at positions corresponding to the second grooves 41, so that the wave structure is formed subsequently at the positions of the source contact region 22 and the drain contact region 23 of the active layer 2 close to the channel region 21. The plurality of second grooves 41 are in one-to-one correspondence with the plurality of second sub-grooves 24 and orthographic projections of the plurality of the plurality of second grooves 41 and the second sub-grooves 24 are overlapped on the base substrate. By forming the light-shielding layer 4 with the second grooves 41 formed by an etching process, additional process steps are not required, so that the manufacturing procedure for the thin film transistor can be simplified and the production cost can be reduced.

It should be noted that, since a corrugated structure is formed on the upper surface of the light-shielding layer 4 with an etching process, after the insulating layer 3 is disposed on the light-shielding layer 4, a same corrugated structure also exists on the upper surface of the insulating layer 3, to define the plurality of second sub-grooves 24 and the plurality of first sub-grooves 25. The thickness of the light-shielding layer 4 may include 500 Å to 1000 Å, and when the thickness of the light-shielding layer 4 is 1000 Å, an etched depth on the upper surface of the light-shielding layer 4 may be less than or equal to 1000 Å.

In some embodiments, the second grooves 41 may penetrate through the light-shielding layer 4 (not shown in the drawings), and at this time, the etched depth on the upper surface of the light-shielding layer 4 is equal to the thickness of the light-shielding layer 4. It should be understood that, the second grooves 41 are disposed at positions corresponding to the portion of at least one of the source contact region 22 and the drain contact region 23 of the active layer 2 close to the channel region 21. Therefore, even if the second grooves 41 penetrate through the light-shielding layer 4, the light-shielding effect on the channel region 21 of the active layer 2 is not substantially affected, and the performance of the thin film transistor is not greatly affected.

It should be noted that, when the light-shielding layer 4 is formed, the plurality of second grooves 41 may not be formed on the upper surface (i.e., the surface distal to the base substrate 1) of the light-shielding layer 4 by an etching process. That is, the upper surface of the light-shielding layer 4 is flat. The wave structure may then be defined by etching a plurality of first grooves 31 on the upper surface of the insulating layer 3 disposed on the light-shielding layer 4, and the plurality of first grooves 31 are in one-to-one correspondence with the plurality of second sub-grooves 24 and orthographic projections of the plurality of first grooves 31 and the plurality of second sub-grooves 24 are overlapped on the base substrate.

The present disclosure also provides a method for manufacturing a thin film transistor, as shown in FIGS. 2 to 5, and the method for manufacturing a thin film transistor provided in this embodiment may be used to manufacture the thin film transistor provided in the above embodiment.

The method for manufacturing the thin film transistor of the present embodiment is described below by taking the manufacturing of the top-gate thin film transistor as an example.

The manufacturing method provided by the embodiment may comprise the following two examples.

Figure 2:
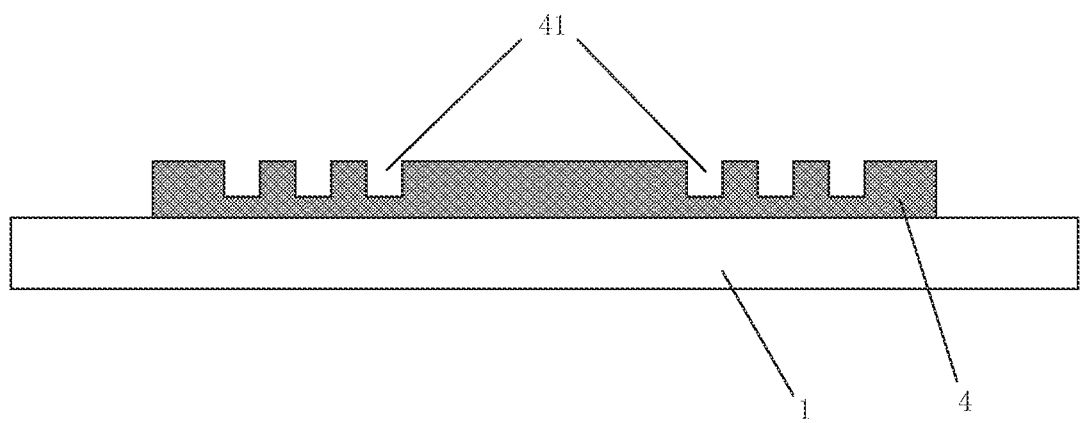
FIG. 2 is a schematic view illustrating a light-shielding layer formed in a method for manufacturing a thin film transistor according to some embodiments of the present disclosure.
Figure 3:
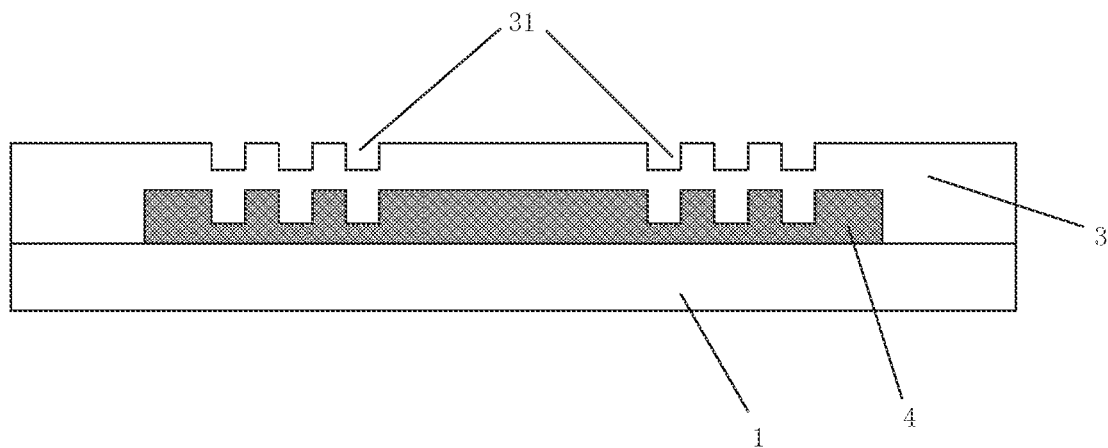
FIG. 3 is a schematic view illustrating an insulating layer formed in a method for manufacturing a thin film transistor according to some embodiments of the present disclosure.
Figure 4:
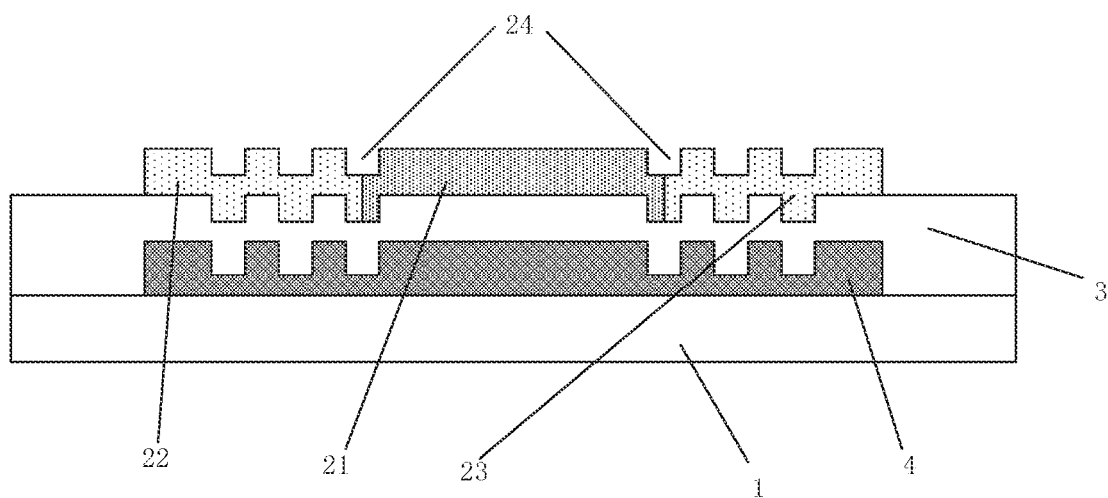
FIG. 4 is a schematic view illustrating an active layer formed in a method for manufacturing a thin film transistor according to some embodiments of the present disclosure.

The first manufacturing method provided in this embodiment is as shown in FIGS. 2 to 4, and includes the following steps S11 to S13.

At step S11, a base substrate 1 is formed, a light-shielding layer 4 is formed on the base substrate 1 by a patterning process, and a plurality of second grooves 41 are formed on an upper surface of the light-shielding layer 4 at positions corresponding to a part of at least one of the source contact region 22 and the drain contact region 23 close to the channel region 21.

A material of the light-shielding layer 4 may include an opaque material such as metal, for example, Al, Mo, or Cu.

Specifically, in this step, as shown in FIG. 2, a photoresist layer is coated on the light-shielding layer 4, and then a pattern of the light-shielding layer 4 having a plurality of second grooves 41 is formed on the base substrate 1 by exposure, development, and etching processes.

At step S12, an insulating layer 3 is formed on the base substrate 1 with the light-shielding layer 4 formed thereon, and a plurality of first grooves 31 are formed on an upper surface of the insulating layer 3 at positions corresponding to the portion of the at least one of the source contact region 22 and the drain contact region 23 of the active layer 4 close to the channel region 21.

As shown in FIG. 3, an entire material layer of the insulating layer 3 is formed directly on the base substrate 1 with the light-shielding layer 4 formed thereon, and with the second grooves 41 in the light-shielding layer 4, the insulating layer 3 will naturally have concaves at positions corresponding to the second grooves 41. That is, the first grooves 31 are formed at positions corresponding to the portion of the at least one of the source contact region 22 and the drain contact region 23 close to the channel region 21.

At step S13, an active layer 2 is formed on the base substrate 1 with the insulating layer 3 formed thereon.

It should be noted that, the wave structure refers to a plurality of first sub-grooves 25 disposed on a side of the active layer 2 proximal to the base substrate 1 and a plurality of second sub-grooves 24 disposed on a side of the active layer distal to the base substrate 1, and the plurality of first sub-grooves 25 and the plurality of second sub-grooves 24 are disposed alternately along a direction parallel to an extension of the channel region 21. It should be noted that, the plurality of first sub-grooves 24 and the plurality of second sub-grooves 25 have a same depth.

Specifically, as shown in FIG. 4, in this step, a material layer of the active layer 2 is directly formed on the base substrate 1 on which the insulating layer 3 is formed. Since the insulating layer 3 has the plurality of first grooves 31, when the material layer of the active layer 2 is formed, the active layer 2 will naturally have concaves at positions of the portion of the at least one of the source contact region 22 and the drain contact region 23 close to the channel region 21 to form the wave structure, and the plurality of first grooves 41 are in one-to-one correspondence with the plurality of second sub-grooves 24, and orthographic projections of the plurality of first grooves 41 and plurality of second sub-grooves 24 are overlapped with each other on the base substrate.

Since a corrugated structure is formed by etching the upper surface of the light-shielding layer 4, after the insulating layer 3 is formed on the light-shielding layer 4, the same corrugated structure also exists on the upper surface of the insulating layer 3, and then the plurality of second sub-grooves 24 and the plurality of first sub-grooves 25 are formed. The thickness of the light-shielding layer 4 may include 500 Å to 1000 Å, and when the thickness of the light-shielding layer 4 is 1000 Å, an etched depth of the upper surface of the light-shielding layer 4 may be less than or equal to 1000 Å.

It is to be understood that, in this step, after a material of the active layer 2 is formed on the base substrate 1 with the insulating layer 3 formed thereon, a step of performing a conductive treatment on the source contact region 22 and the drain contact region 23 of the active layer 2 is further included. The method for the conductive treatment may be an ion implantation method including an ion implantation method with a mass analyzer, an ion cloud implantation method without a mass analyzer, a plasma implantation method, or a solid diffusion implantation method. The method for the conductive treatment may also be performed by ion bombardment, which hydrogenates or de-oxidizes an oxide semiconductor material in a region to be subjected to the conductive treatment.

Figure 5:
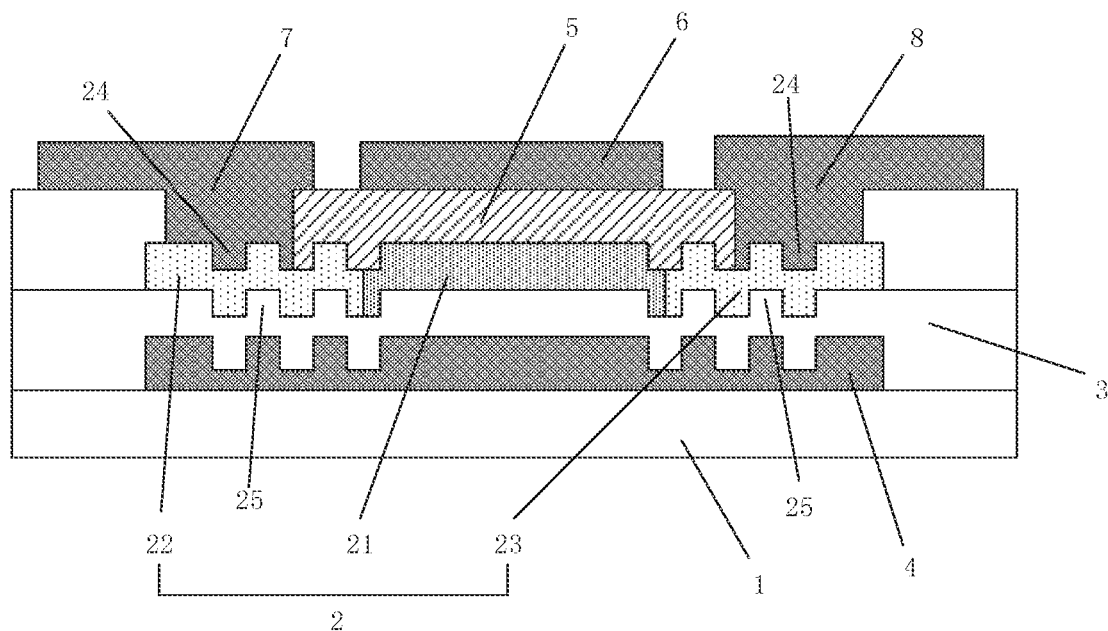
FIG. 5 is a schematic structural view illustrating a gate insulating layer, a gate, a source and a drain formed in a method for manufacturing a thin film transistor according to some embodiments of the present disclosure.

In some embodiments, as shown in FIG. 5, the method of the present embodiment may further include a step of forming a gate insulating layer 5, a gate 6, a source 7, and a drain 8 of the thin film transistor on the base substrate 1, which is not described herein again.

Figure 6:
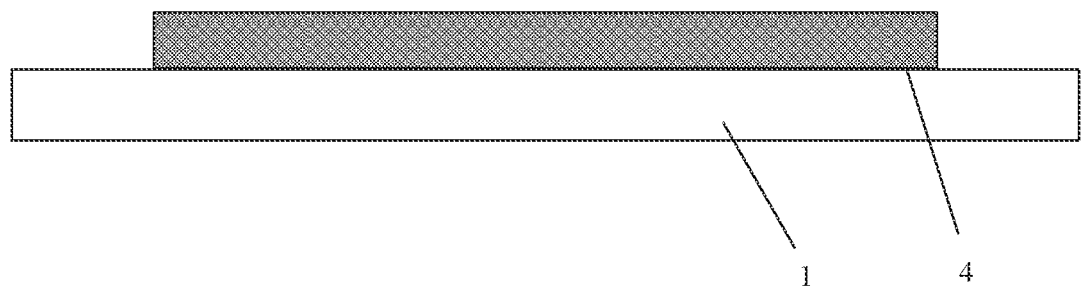
FIG. 6 is a schematic view illustrating a light-shielding layer formed in a method for manufacturing a thin film transistor according to some embodiments of the disclosure.
Figure 7:
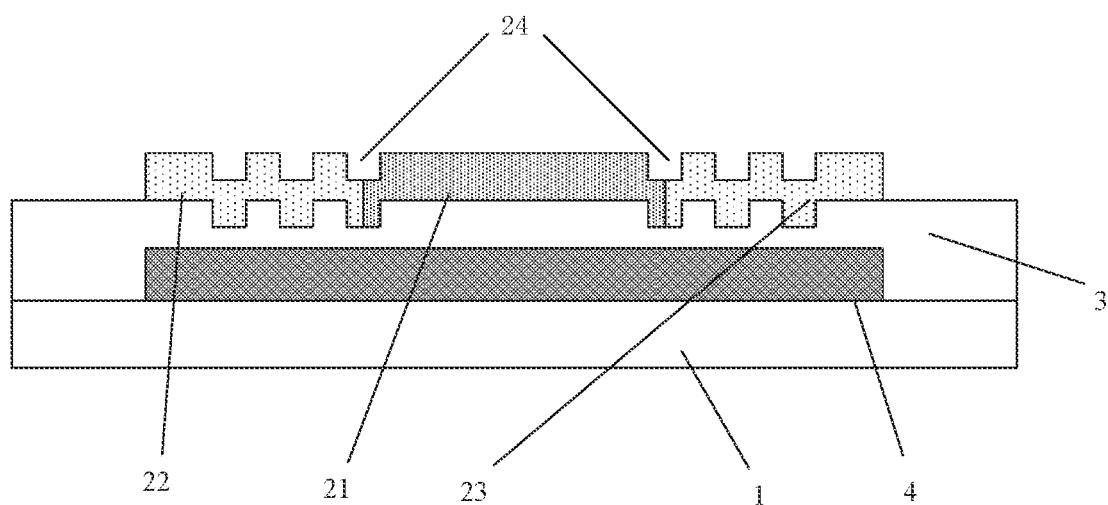
FIG. 7 is a schematic view illustrating an active layer formed in a method for manufacturing a thin film transistor according to some embodiments of the present disclosure.
Figure 10:
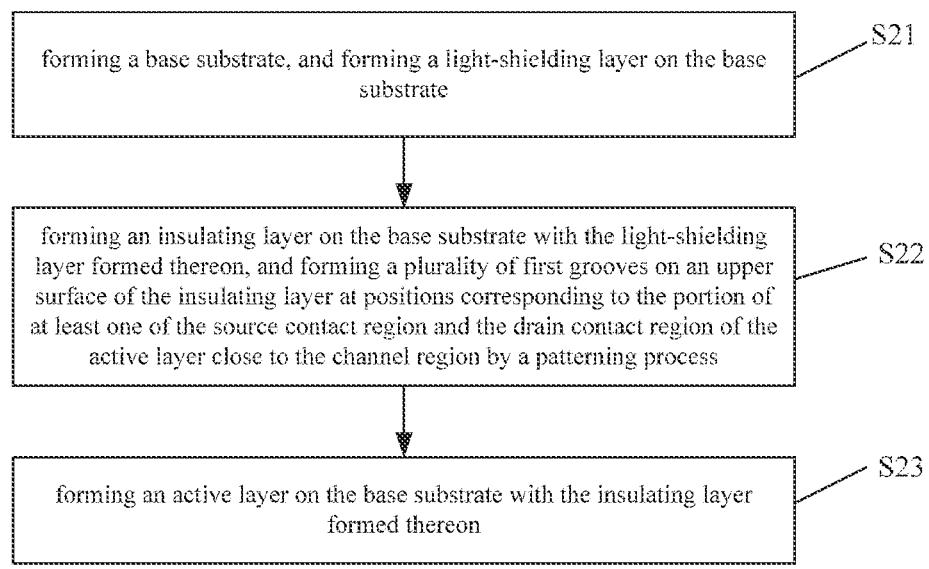
FIG. 10 is a flowchart of a method for manufacturing a thin film transistor according to some embodiments of the present disclosure.

The second manufacturing method provided in this embodiment, referring to FIGS. 6 to 8, includes the following steps S21 to S23.

The second manufacturing method is similar to the first manufacturing method except that the plurality of first grooves 31 are formed directly on the upper surface of the insulating layer 3 without forming the plurality of second grooves 41 on the light-shielding layer 4 in the second manufacturing method. Specifically, the method comprises the following steps.

At step S21, a base substrate 1 is formed, and a light-shielding layer 4 is formed on the base substrate 1.

As shown in FIG. 6, a light-shielding layer 4 is first formed on the base substrate 1, and the light-shielding layer 4 is configured to shield external light to prevent the active layer 2 from being affected by the external light and damaging the performance of the thin film transistor. The material of the light-shielding layer 4 may include metal, and the metal with good light reflectivity is required, which is conventionally Al, Mo, or Cu.

It should be noted that, the upper surface of the light-shielding layer 4 is a flat surface, and therefore it is not necessary to form the plurality of second grooves 41 while forming the pattern of the light-shielding layer 4 by the patterning process.

At step S22, an insulating layer 3 is formed on the base substrate 1 on which the light-shielding layer 4 is formed, and forming a plurality of first grooves 31 on an upper surface of the insulating layer 3 at positions corresponding to at least one of the source contact region 22 and the drain contact region 23 of the active layer 2 close to the channel region 21 by a patterning process.

It should be noted that, when the material of the insulating layer 3 was coated, a common light-shielding agent may be injected into the insulating layer 3 to make the insulating layer 3 opaque, to play a role of shielding light and avoid the influence of light on the active layer 2. At this time, since the insulating layer 3 can simultaneously realize the insulating function and the light-shielding function, the light-shielding layer 4 may not be additionally provided (not shown in the drawings).

At step S23, an active layer 2 is formed on the base substrate 1 on which the insulating layer 3 is formed.

It should be noted that, the wave structure refers to a plurality of first sub-grooves 25 disposed on a side of the active layer 2 proximal to the base substrate and a plurality of second sub-grooves 24 disposed on a side of the active layer distal to the base substrate, and the plurality of first sub-grooves 25 and the plurality of second sub-grooves 24 are disposed alternately along a direction parallel to an extension of the channel region 21. It should be noted that the plurality of first sub-grooves 24 and the plurality of second sub-grooves 25 have the same depth.

Specifically, in this step, as shown in FIG. 7, the material layer of the active layer 2 may be directly formed on the base substrate 1 on which the insulating layer 3 is formed. Since the insulating layer 3 has the plurality of first grooves 31, when the material layer of the active layer 2 is formed, the material layer of the active layer 2 certainly have concaves at positions of the portion of the source contact region 22 and the drain contact region 23 close to the channel region 21 to form the wave structure, and the plurality of first grooves 31 are in one-to-one correspondence with the plurality of second sub-grooves 24 and orthographic projections of the plurality of first grooves 31 and the plurality of second sub-grooves 24 are overlapped with each other on the base substrate.

The plurality of second sub-grooves 24 and the plurality of first sub-grooves 25 are formed by the corrugated structure of the upper surface of the insulating layer 3 formed by an etching process. The thickness of the insulating layer 3 may include 2000 Å to 6000 Å, and in some embodiments, the etched depth on the upper surface of the insulating layer 3 may be 1000 Å. At this time, the depth of the plurality of second sub-grooves 24 and the plurality of first sub-grooves 25 is 1000 Å.

It will be appreciated that in this step, after the material layer of the active layer 2 material is formed on the base substrate 1 on which the insulating layer 3 is formed, a step of performing a conductive treatment on the source contact region 22 and the drain contact region 23 is also included. The method for the conductive treatment may be an ion implantation method including an ion implantation method with a mass analyzer, an ion cloud implantation method without a mass analyzer, a plasma implantation method, or a solid diffusion implantation method. The method for the conductive treatment may also be performed by ion bombardment, which hydrogenates or de-oxidizes an oxide semiconductor material in a region to be subjected to the conductive treatment.

In some embodiments, as shown in FIG. 8, the method of this embodiment may further include a step of forming a gate insulating layer 5, a gate 6, a source 7, and a drain 8 of the thin film transistor on the base substrate 1, which is not described herein again.

In this embodiment, since the portion of the source contact region 22 and the drain contact region 23 close to the channel region 21 has the wave structure, compared with the thin film transistor in the prior art, the thin film transistor in this embodiment has a longer transmission path of the conductive diffusion effect and a smaller influence of the conductive diffusion effect on the channel region 21, so that good performance and uniformity of the manufactured thin film transistor can be ensured. Meanwhile, in the wave structure of the portion of the active layer 2, the atoms of the material of the active layer 2 are arranged distorted and disordered, so that the conductive diffusion effect on the channel region 21 can be well blocked, and good performance and uniformity of the thin film transistor can be ensured.

In some embodiments, a plurality of second sub-grooves 24 may alternatively be formed at positions of the part of at least one of the source contact region 22 and the drain contact region 23 directly when the active layer 2 is formed by a patterning process (not shown).

Embodiments of the present disclosure also provide a display substrate, including: a base substrate 1 and a thin film transistor disposed on the base substrate 1. The thin film transistor in this embodiment may be any one of the thin film transistors provided in the above embodiments.

Since the display substrate in this embodiment includes the thin film transistor in the above embodiment, the thin film transistor in this embodiment has a low degree of conductivity in the channel region 21 of the active layer 2, and has good performance and good display effect.

The embodiment of the present disclosure further provides a display apparatus, which includes the display substrate provided by the above embodiment.

Specifically, the display apparatus in this embodiment may be: a display apparatus including any product or component with a display function, such as a liquid crystal panel, electronic paper, a mobile phone, a tablet personal computer, a television, a display, a notebook computer, a digital photo frame, a navigator and the like.

Since the display apparatus of the embodiment includes the display substrate provided in the above embodiment, the display apparatus of the embodiment has a better display effect than the display apparatus in the prior art.

It will be understood that, the above embodiments are merely exemplary embodiments employed to illustrate the principles of the present disclosure, and the present disclosure is not limited thereto. It will be apparent to a person skilled in the art that, various changes and modifications can be made without departing from the spirit and scope of the disclosure, and these changes and modifications are to be considered within the scope of the disclosure.

What is claimed is:

1. A thin film transistor, comprising:
   a base substrate,
   an active layer disposed on the base substrate, the active layer comprising a channel region, and a source contact region and a drain contact region respectively located at two sides of the channel region;
   wherein a portion of at least one of the source contact region and the drain contact region close to the channel region comprises a plurality of first sub-grooves disposed at a side of the active layer proximal to the base substrate and a plurality of second sub-grooves disposed at a side of the active layer distal to the base substrate, and the plurality of first sub-grooves and the plurality of second sub-grooves are disposed alternately along a direction parallel to an extension of the channel region.

2. The thin film transistor of claim 1, wherein the plurality of first sub-grooves and the plurality of second sub-grooves have a same depth.

3. The thin film transistor of claim 2, further comprising an insulating layer provided between the active layer and the base substrate;
   wherein the insulating layer is provided with a plurality of first grooves at a side of the insulating layer proximal to the active layer, the plurality of first grooves are provided in the insulating layer at positions corresponding to the at least one of the source contact region and the drain contact region of the active layer close to the channel region, the plurality of first grooves are in one-to-one correspondence with the plurality of second sub-grooves, and orthographic projections of the plurality of first grooves and the plurality of second sub-grooves on the base substrate are overlapped, respectively.

4. The thin film transistor of claim 1, further comprising an insulating layer provided between the active layer and the base substrate;

wherein the insulating layer is provided with a plurality of first grooves at a side of the insulating layer proximal to the active layer, the plurality of first grooves are provided in the insulating layer at positions corresponding to the at least one of the source contact region and the drain contact region of the active layer close to the channel region, the plurality of first grooves are in one-to-one correspondence with the plurality of second sub-grooves, and orthographic projections of the plurality of first grooves and the plurality of second sub-grooves on the base substrate are overlapped, respectively.

5. The thin film transistor of claim 4, further comprising a light-shielding layer disposed between the base substrate and the insulating layer.

6. The thin film transistor of claim 5, wherein the light-shielding layer is provided with a plurality of second grooves at a side of the light-shielding layer proximal to the insulating layer, the plurality of second grooves are provided in the light-shielding layer at positions corresponding to the at least one of the source contact region and the drain contact region of the active layer close to the channel region, the plurality of second grooves are in one-to-one correspondence with the plurality of second sub-grooves, and orthographic projections of the plurality of second grooves and the plurality of second sub-grooves on the base substrate are overlapped, respectively.

7. The thin film transistor of claim 6, wherein the plurality of second grooves penetrate through the light-shielding layer.

8. The thin film transistor of claim 5, wherein a material of the light-shielding layer comprises aluminum, molybdenum, or copper.

9. The thin film transistor of claim 1, further comprising a gate insulating layer, a gate, and a source and a drain sequentially disposed on the active layer.

10. A method for manufacturing a thin film transistor, comprising:
forming a base substrate, and forming an active layer on the base substrate such that the active layer comprises a channel region, and a source contact region and a drain contact region respectively located at two sides of the channel region; and
forming a plurality of first sub-grooves at a side of the active layer proximal to the base substrate and a plurality of second sub-grooves at a side of the active layer distal to the base substrate at a portion of at least one of the source contact region and the drain contact region of the active layer close to the channel region such that the plurality of first sub-grooves and the plurality of second sub-grooves are disposed alternately along a direction parallel to an extension of the channel region.

11. The method of claim 10, wherein the plurality of first sub-grooves and the plurality of second sub-grooves have a same depth.

12. The method of claim 11, wherein before the forming the active layer on the base substrate, the method further comprises:
forming an insulating layer on the base substrate, and forming a plurality of first grooves on a side of the insulating layer proximal to the active layer at positions corresponding to the portion of the at least one of the source contact region and the drain contact region of the active layer close to the channel region; and
forming the active layer on the base substrate on which the insulating layer is formed such that the plurality of first grooves are in one-to-one correspondence with the plurality of second sub-grooves, and orthographic projections of the plurality of first grooves and the plurality of second sub-grooves on the base substrate are overlapped, respectively.

13. The method of claim 10, wherein before the forming the active layer on the base substrate, the method further comprises:
forming an insulating layer on the base substrate, and forming a plurality of first grooves on a side of the insulating layer proximal to the active layer at positions corresponding to the portion of the at least one of the source contact region and the drain contact region of the active layer close to the channel region; and
forming the active layer on the base substrate on which the insulating layer is formed such that the plurality of first grooves are in one-to-one correspondence with the plurality of second sub-grooves, and orthographic projections of the plurality of first grooves and the plurality of second sub-grooves on the base substrate are overlapped, respectively.

14. The method of claim 13, wherein before the forming the insulating layer on the base substrate, the method further comprises forming a light-shielding layer on the base substrate.

15. The method of claim 14, wherein the forming the light-shielding layer on the base substrate comprises:
forming the light-shielding layer on a base substrate by a patterning process, and forming a plurality of second grooves on a side of the light-shielding layer proximal to the insulating layer at positions corresponding to the portion of the at least one of the source contact region and the drain contact region of the active layer close to the channel region such that the plurality of second grooves are in one-to-one correspondence with the plurality of second sub-grooves, and orthographic projections of the plurality of second grooves and the plurality of second sub-grooves on the base substrate are overlapped, respectively.

16. The method of claim 15, wherein the plurality of second grooves penetrate through the light-shielding layer.

17. The method of claim 14, wherein a material of the light-shielding layer comprises aluminum, molybdenum, or copper.

18. The method of claim 10, further comprising forming a gate insulating layer on the active layer, and forming a gate, a source and a drain on the gate insulating layer.

19. A display substrate, comprising:
a base substrate, and
a thin film transistor disposed on the base substrate;
wherein the thin film transistor comprises the thin film transistor of claim 1.

20. A display apparatus comprising the display substrate of claim 19.

* * * * *